(12) United States Patent
Matsui

(10) Patent No.: US 6,855,883 B1
(45) Date of Patent: Feb. 15, 2005

(54) ELECTROMAGNETIC WAVE BLOCKING MATERIAL AND ELECTROMAGNETIC WAVE BLOCKING CASE

(75) Inventor: Hideki Matsui, Osaka (JP)

(73) Assignee: Kazu Investment Co., Ltd., Izumisano (JP)

( * ) Notice: Subject to any disclaimer, the term of this patent is extended or adjusted under 35 U.S.C. 154(b) by 0 days.

(21) Appl. No.: 09/601,684

(22) PCT Filed: Feb. 9, 1998

(86) PCT No.: PCT/JP98/00519

§ 371 (c)(1),
(2), (4) Date: Aug. 7, 2000

(87) PCT Pub. No.: WO98/35543

PCT Pub. Date: Aug. 13, 1998

(30) Foreign Application Priority Data

Feb. 11, 1997 (JP) .............................................. 9-043052

(51) Int. Cl.[7] .................................................. H05K 9/00
(52) U.S. Cl. .................................................. 174/35 MS
(58) Field of Search .......................... 174/35 MS, 35 R; 361/816, 818

(56) References Cited

U.S. PATENT DOCUMENTS

| | | | | |
|---|---|---|---|---|
| 4,812,854 A | * | 3/1989 | Boan et al. .................. | 343/897 |
| 4,978,812 A | * | 12/1990 | Akeyoshi et al. ...... | 174/35 MS |
| 5,316,830 A | * | 5/1994 | Adams et al. ........... | 428/195.1 |
| 6,054,647 A | * | 4/2000 | Ridener .................. | 174/35 MS |

* cited by examiner

Primary Examiner—Hung V. Ngo
(74) Attorney, Agent, or Firm—Westerman, Hattori, Daniels & Adrian, LLP (57) ABSTRACT

This invention provides the electromagnetic waves shield material that has a sufficient effect of shielding the electromagnetic waves by making the electric conductive fibers into mesh. And this invention also provides the electromagnetic waves shield mobile phone case that avoids a harmful effect on the human body without reducing the function of communication of the mobile phone used the said electromagnetic waves shield material.

The fibers with electric conductivity are woven into mesh by a general knitting machine like a machine for tricot. The cost is low even used for the wide area to shield the electromagnetic waves because the consumption of the fibers needed is less. The coarseness of the net is maintained the same by controlling the movement of the length and breadth each other.

To avoid the radiation to the head direction, the electromagnetic waves shield material is used for the front and upper sides of the mobile phone case which are the direction to the head when the mobile phone is in use. The regular material without electromagnetic waves shield effect is used for the both sides of the mobile phone case.

The antenna cap with electromagnetic shield structure is attached to the said upper side of the electromagnetic wave shield case. The electricity with high frequency is conducted between the above antenna cap and the upper side of the electromagnetic wave shield case. The said antenna cap is a conic tube cut it's head obliquely. The opening part is made to face in the opposite side of the head when it is attached to the antenna. A metallic pin is attached to the outside of the antenna cap. This metallic pin conducts high frequent electricity with the wire antenna at the mobile phone body when it is attached. It functions as an additional antenna to the wire antenna at the mobile phone body.

4 Claims, 7 Drawing Sheets

Side of the antenacap

(a) Left side  (b) right side

(c) the figer from the upper side

Figure 9

(a) normal (a cap is attached)

(b) when a cap is deattached

ELECTROMAGNETIC WAVE SHIELDING RATE
TEST OF MG NET (summary)

Test working day: December 10, 1997

Measurement person: America Pennsylvania state-run college
  Electron sound material & apparatus engineering research center
  Prof. Vijay K. Varadan
  (A Doctor of Engineering: a specialist of electrical machinery, machine, and natural science)

The measurement facilities: HVS Technologies, Inc.
  (An electron sound engineering research center belonging electromagnetic wave absorption shielding material and test equipment specialized agencies)

A use electromagnetic wave shielding material: MG net electromagnetic wave screening material

Measurement instrument: HVS Free Space Microwave Measurement System

Instrumentation: MG net electromagnetic wave absorption factor and also permeation attenuation rate
  Frequency 0.045 GHz ~ 1.4 GHz
  Frequency 7.75 GHz ~ 13.0 GHz

By using the method: HVS Free Space Microwave Measurement System electromagnetic wave absorption factor and permeation attenuation rate of MG net a measurement

Test as a result of: Frequency 0.045 GHz ~ 1.4 GHz at the time of
  Around 1% of absorption factor
  Blocking rate 97% ~ 99% or more
  Frequency 7.75 GHz ~ 13.0 GHz at the time of
  Around 1% of absorption factor
  Blocking rate 90% ~ 99% or more

The comment of the Dr. Varadan: this material is an ideal material as an electromagnetic wave blocking material.
  It is when send to a market and use to many electrical machinery and apparatus including a mobile phone now.

ELECTROMAGNETIC WAVE BLOCKING MATERIAL AND ELECTROMAGNETIC WAVE BLOCKING CASE

FIELD OF INVENTION

This invention relates to the electromagnetic waves shields and the electromagnetic waves shield mobile phones cases. Especially, it relates to mobile phone cases and the shields that are effective to shield the human head from the electromagnetic waves when mobile phones are in use.

BACKGROUND OF THE INVENTION

Recently, the effect on the human bodies by the electromagnetic waves generated from the personal computers, TV sets and other electrical appliances is a problem. Especially, the mobile phones radiate high frequency waves between 800 MHz and 1.5 GHz. Although the generating power is weak, it is necessary to shield human head from the electromagnetic waves as they are used close to the human head. And the malfunction and the trouble of the Pacemaker and the hearing aids caused by the electrical appliances are becoming a social problem.

Use of the mobile phones in the automatic control system car and the airplane may cause a big accident by malfunctioning the computer system. Moreover, the high frequency electromagnetic waves are harmful to the cell or the immune system in the human bodies and it is on the issue and the study has begun.

In order not to emit the electromagnetic waves, it is effective to use the electromagnetic waves shield. However, mobile phones need to emit the electromagnetic waves for the radio communication. A device is needed to shield the electromagnetic waves only to the head direction.

For this purpose, the ear covers have been attempted to shield the user side from the mobile phone, and an attempt of shielding the electromagnetic waves to the head direction using the plate on the mobile phone wire antenna was made. But, the former is troublesome to wear, and the structure of the latter did not have the enough shield effect.

Also, electric instrument (especially, read only memory including the memory) were many examples that actuate wrong by external noise each. We cannot find the good handling and cheap material for protecting the external noise. It is serious that the important monitor of the hospital actuates wrong and also the pacemaker for the heart diseases actuates wrong with portable telephone and the others especially, and there was not a cheap effective thing the electromagnetic waves shields for the prevention of this external noise.

As the products to prevent from the harmful electromagnetic waves, there have been a nickel coating polyester, OA apron used a metal texture and the like, the transparent hard plastic VDT (Video Display Terminal) filter and so on. The above OA apron is easily stained and the stain is conspicuous. When the material for the above OA apron is used for the mobile phone cases, the thin material causes the deformation of the shape and so on as the mobile phones often held by hands. It is not convenient to use them.

It is necessary to confirm the location, the function, and the content of the indication and the like on the display, the control part of the switch and the keys on the above electric appliances from out side of the cases. It is necessary to cover the cases with the transparent material. However, when the transparent hard plastic material for the above VDT filter is used for the operating part of the switch and the keys and the like, it harms the control of the electric instruments. Because it is unable to operate the switch and the keyboard from out side of the case.

A special loom is needed to weave the texture with micro order metal fiber. It results the high cost of the texture. Accordingly, when the other large-sized appliances like the washing machine and the dryer are taken up as the appliances to be shield from the electromagnetic waves, the required cost of the electromagnetic waves shield will be high. To solve this problem, it could be thought to weave the mesh roughly to reduce the use of the amount of the metal fiber. But it will cause a deformation of the metal fibers because it moves lengthwise and crosswise. Consequently, 1.5 mm, the size of the meshes, cannot be maintained. It is known by way of experiment that the above mesh size of 1.5 mm has the enough effect on the electromagnetic waves shield.

SUMMARY OF THE INVENTION

The electromagnetic waves shield net that has a high shielding effect against the electromagnetic waves is used for this invention as the material for the above mobile phone cases. The electromagnetic waves shield nets that have the conductivity of the electricity are weaves in below 1.5 mm mesh. It enables the use of a common loom for tricot, and the less use of the fiber. The less use of the fiber enables the low cost of the electromagnetic waves shield required for the wide-sized appliances. Controlling each other, the mesh length and breadth maintain the coarseness unchangeable. The rate of the reflection and the absorption of the electromagnetic waves become high due to the conductivity between the fibers twisted around the crossings of the nets.

The said electromagnetic waves shield net can be used as an effective and simple electromagnetic waves shield materials by pasting to the adhesive sheets or bonding sheets. They can be used and easily attached around the drivers' sheets, the cockpits, the passenger sheets, out side of the appliances, and the metals and synthetic resin on the walls in the rooms.

The said electromagnetic waves shield nets can also be used as the transparent, soft and elastic electromagnetic waves shield materials. Pasting the electromagnetic waves shield mesh nets and the transparent flexible and soft polyvinyl chloride in laminate processing makes it. The electromagnetic waves shield mesh nets are twisted and have the conductivity before pasting.

The said electromagnetic waves shield nets can be used as a high-grade electromagnetic waves shield material that is stainless and stains are not found easily even if it is stained. It maintains the shape when sewed in cubic. It is made by putting the basic cloth of synthetic leather and above electromagnetic waves shield nets which have been twisted and have the conductivity.

This invention is the electromagnetic waves shield net and the electromagnetic waves shield material, which have high shield effect against electromagnetic waves. Twisting the fibers that have the conductivity makes it. The fiber is coiled up and increases the twisted surface area. Increased surface area increases the rate of reflection, absorption of the electromagnetic waves and the electromagnetic waves shield effect.

In the effect to the human body from the electromagnetic waves, especially the effect to the adjacent head is a problem. Ideally, it is desirable to shield all the electromagnetic waves to the head direction. However, it is impossible to shield only one direction because the electromagnetic waves with the frequency between 800 MHz and 1.5 GHz go around the mobile phone antenna. And as mentioned above, the sensitivity of the communication should not go down when the human head is shielded from the electromagnetic waves, because the mobile phone is needed to be used for communication.

Principal object of the invention is to provide the mobile phone cases whose structure has the electromagnetic waves shield effect to the head direction during the use of the mobile phones without letting the sensitivity of the communication down.

And moreover, this invention aims to provide the specially shield mobile phone cases for the mobile phones. Without adding any special neither process, nor requiring any special instrument to the generally sold mobile phone. The structure of the above mobile phone case does not let down the sensitivity of the necessary electromagnetic waves for communications to the directions other than head, and reduces the electromagnetic waves to the head direction to the utmost.

The mobile phone case related to this invention uses the electromagnetic wave shield structure material on the front and upper side of the mobile phone cases that are the direction to the head during the mobile phone use. Regular material with no electromagnetic waves shield is used on the both sides of the cases. These structures shield the user's head against the radiation of the electromagnetic waves to the users head direction during the use of the mobile phones. The backside of the cases does not need the shield structure. However, on the point of shielding the whole cases, the shield structure material also could be used for the back side of the cases.

Moreover, on the top of the above electromagnetic waves shield material, the electromagnetic waves shield antenna cap is attached. The electricity of high frequency is conducted between the electromagnetic shield antenna cap and the said electromagnetic shield material. The said antenna is a conic tube whose head is cut slantwise. When this open cut part is attached to the wire antenna, it is made to face in the opposite direction of the user's head, that is slantwise upper side, open part faced to slightly backward. A sheet of the cloth is fold to make the above conic-tube shape antenna cap. The shortest distance between the upper side and the bottom side of the above conic tube is seamed in French seam. A metal pin is attached to the part of the French seam.

The structure of the metal pin conducts high frequency electricity to the wire antenna of the mobile phone body when the antenna cap is attached. And it functions as a subsidiary antenna for the wire antenna of the mobile phone body to the out side. The attaching the said cap means shielding the electromagnetic waves at the antenna and there is a fear of the drop of the sensitivity of the communication. Above pin has a role to expose the end of the wire antenna of the mobile phone to out side of the shield that is made by the said antenna cap.

The radiation of the electromagnetic waves from the upper side of the mobile phone case is frequent. The case cover can be put on and taken off by the magic tapes at the upper side. When it is made ordinary way, the cover becomes thin at the upper side of the case and the both upper sides of the case are exposed to the out side. In this invention, to limit the radiation of the electromagnetic waves, the structure of the shield cover is made to cover the both upper front sides of the case by keeping the widths of the case from the bottom to the upper side the same.

DESCRIPTION OF THE DRAWINGS (FIG. 1)
Enlarged figure of the electromagnetic waves shield nets used for this invention (FIG. 2)
The decomposed structure figure of the electromagnetic waves shield material used for this invention (FIG. 3)
The other example of the sidelong figure of the electromagnetic waves shield material used for this invention (FIG. 4)
The other example of the decomposed structure figure of the electromagnetic waves shield material of this invention (FIG. 5)
The other example of the decomposed structure figure of the electromagnetic waves shield material of this invention (FIG. 6)
The whole figure of the mobile phone case of this invention (FIG. 7)
The part of the enlarged figure of the mobile phone case of this invention (FIG. 8)
The figures of the both sides and the upper side of this mobile phone case invention (FIG. 9)
The figure of the way to use the antenna cap of this invention (FIG. 10)
The whole sidelong figure of the mobile phone case of this invention (FIGS. 11, 12)
It is the figure that shows the measurement result of the electromagnetic wave absorptive and transmission-damping rate of the electromagnetic wave shielding net that are used to this invention.

DESCRIPTION OF THE PREFERRED EMBODIMENT

Figure 1:
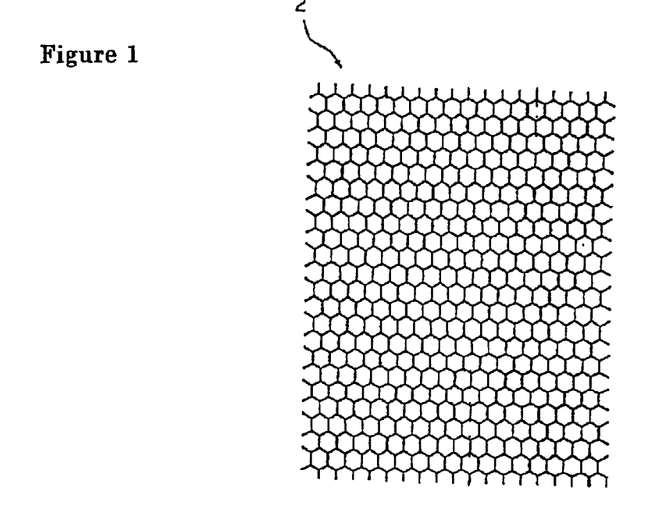

The FIG. 1 is the enlarged figure of the electromagnetic waves shield net used for this invention.

This electromagnetic waves shield net 2 is the net that the thread twist two fibers with conductivity are knitted by tricot knitting. The former material is made by metal fibers (silver, copper, nickel and so on), carbon fibers with conductivity. The coarseness of the mesh is below 1.5 mm that is known that it has an enough electromagnetic shield effect by way of experiment.

The twist thread is stronger than no twist thread, and The processing is possible with a usual tricot knitting machine. The new equipment is not necessary through the means that the above processing becomes possible with a usual tricot knitting machine. We can give the above net with a cheap cost more greatly, in comparison with the one that used a special facilities and knitting machine. Also, it is the net of defect; therefore, we can less the expensive electric conduction nature fiber material than a cloth of electric conduction nature fiber, and it is able to manufacture it with the hypo cost furthermore The tricot knitting is different from basic knitting, because the tricot knitting use three thread and basic knitting use one thread. Three thread tricot knitting make hexagon form. The hexagon form fixates the birthplace and the thread of the length and breadth of the knitting binds the partner mutually. Therefore the coarseness of the knitting eye is maintained the knitting collapses to certain and do not cause. Accordingly, that electric conduction nature (the shielding effect) falls off and the knitting enlarges by stretching able to be prevented.

As it is seen to the net intention of tricot knitting furthermore, the swelling of here does the reflection/absorption effect of the electromagnetic wave and the electromagnetic wave blocking effect is big more the net of a usual length and breadth type. In other words, the electric conduction nature fiber material (the thread) interdicts in the spiral state by making the thread and twine and Mass increases of to every area and the electromagnetic wave shielding effect rises. Also, the spiral structure of the above electric conduction nature fiber material (the thread) the certain research report even the absorption effect of the electromagnetic wave is done.

Electric conduction metal of electromagnetic wave shielding effect and fiber of which has the flexibleness and processing of which hold this material is easy to do combine. Also, the knitting eye of above defect is equipped to seeing through nature. The compatibility of this material is very high from these many advantages. We can state orally it application is produced to the second various material and product as bellows.

Furthermore, one of two pieces may be used a usual anelectric conduction nature material from the point of a cost because each measure eye of an electric conduction nature material is settling down within 1.5 mm, in the case of the tricot knitting that does not do that and collapse the eye, although it is desirable to use a said electric conduction nature fiber material (a thread) in all of two pieces and a thread is inferior and can also use this constitution because it does not do it (for example nylon). On the contrary, we twine by using an electric conduction nature material (a thread) in all of both conversely, and case as a thread collapses a little the eye because an electromagnetic wave shielding effect is big and may knit it a net with way of knitting of the others which it does.

Also, the one that the above electric conduction nature material (the thread) plated silver to a nylon thread is suitable. As for this material, the ratio resistance is below 0.05 Ω/sq. and the electric conduction nature is high more electric conduction nature rubber. As for this material, the ratio resistance is below 0.05 Ω/sq. and the electric conduction nature is high more electric conduction nature rubber. Accordingly, we can use this material to the contact part of a switch element. The experiment result of the electromagnetic wave shielding rate of the electromagnetic wave shielding net of this invention is shown in the 11th figure, the 12th figure. The measurement is carried out at the Pennsylvania University by using the apparatus of the 13th figure and the testing ground evaluation is shown in the table of the 14th figure. Furthermore, the same table in, "MG net" and it are the product name of the electromagnetic wave shielding net of this invention. The 11th figure and also the 12th figure are the one that measured an electromagnetic wave absorption factor and also permeation attenuation rate in the apparatus of the 13th figure. To how much the permeation attenuation quantity becomes in the case that it put the electromagnetic wave shielding net of this invention to a free space, is measured and the shielding effect of the above electromagnetic wave shielding net is evaluated. Also, the electromagnetic wave absorption factor of this net is calculated by that calculates the remaining part of the total between the reflection coefficient of a permeation attenuation rate and above net. It is clear that the electromagnetic wave shielding net of this invention has a sufficient electromagnetic wave shielding effect extending from a low frequency to high frequency from a figure. The permeation attenuation quantity is 90% in a 10 GHz neighborhood 97%, with the 1.4 GHz following. As for this experiment the net is, the shielding effect is clear that it rises more if a net is piled up furthermore the thing of 1 layer.

On the half-finished goods of the above electromagnetic shield net 2, the colors, for example, the black acrylic colors contained the solvent is sprayed. The basic material of the polyester fibers are dissolved by the color solvent and congealed as they are. It fixes the electromagnetic waves shield net 2 mesh. The purpose of attaching the electromagnetic waves shield net 2 to the transparent soft sheet material to be used for the control panel of the mobile phone cases is only for an easy reading of the control panel. Other colors can be used and spraying the acrylic color without dying is OK to fix the mesh.

No special knitting machine is required to knit the electromagnetic waves shield net 2. The consumption and the cost of the fibers are low when it is used even for the large appliances like washing machines, drying machines that need a wide area to shield the electromagnetic waves.

The length and breadth of the above electromagnetic waves shield net 2 control the moves each other. The coarseness of the mesh is maintained below 1.5 mm that is effective to shield the electromagnetic waves and shield the high frequency electromagnetic waves of above 200 MHz.

The conductivity of the fibers tangled each other at the crossing of the mesh makes the rate of reflection and absorption and electromagnetic waves shield effect increase.

The fibers with conductivity are wound up in a coil by twisting. The increased face area gains the rate of reflection and the absorption of the electromagnetic waves and increases the electromagnetic waves shield effect.

In this invention, the metal fibers, the carbon fibers and so on that are twisted with the synthetic fibers like polyester are described. It is possible to use the material by twisting simple metal fibers and the carbon fibers also.

Above electromagnetic waves shield net 2 can be used for the material for the various processed goods. In addition, it can be used for the interlining of the cloths, the inner layer of the electric carpet, and the inner layer of the building materials (the materials for the inner walls, the ceilings, the floors and so on).

Figure 2:
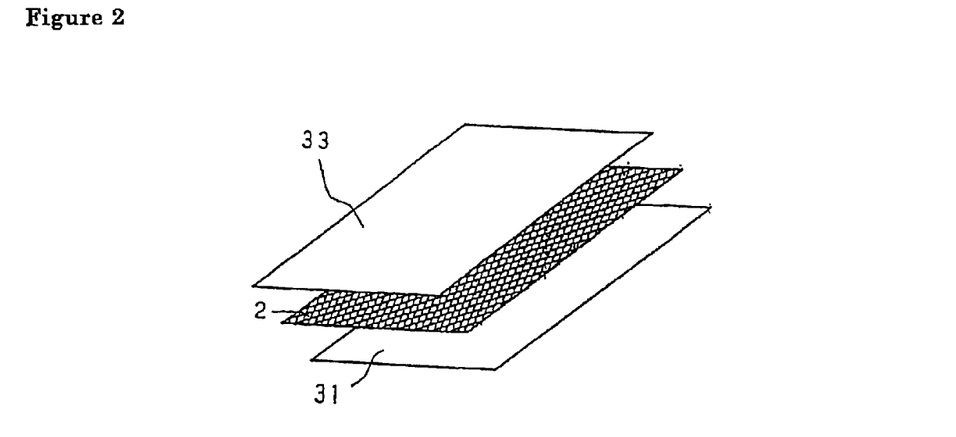

The FIG. 2 is the example of the decomposed structure of the electromagnetic waves shield material used for this invention.

In this example of the electromagnetic waves shield material, the electromagnetic waves shield net 2 is pasted to the face of the adhesive sheet 31. The adhesive face is covered with a strippable paper 33 coated with silicone before it is used. This example of the electromagnetic waves shield material can be made by providing the electromagnetic waves shield net 2 into the strippable paper 33 in the process of rolling up with the adhesive sheet 31. The adhesive is applied to one side of the supporter of the adhesive sheet 31.

This example of the electromagnetic waves shield material is fit to use for the inner linings because it is easy to adhere to the metals, synthetic resins and so on. They are the home electrical appliances (the washing machines, the dryers and so on), the communication equipment like mobile phones, sockets, breaker covers, the sides and back of the monitors, around the engines and the driver's sheets of the cars, the interior furnishings of the air plains, and the cockpits.

Figure 3:
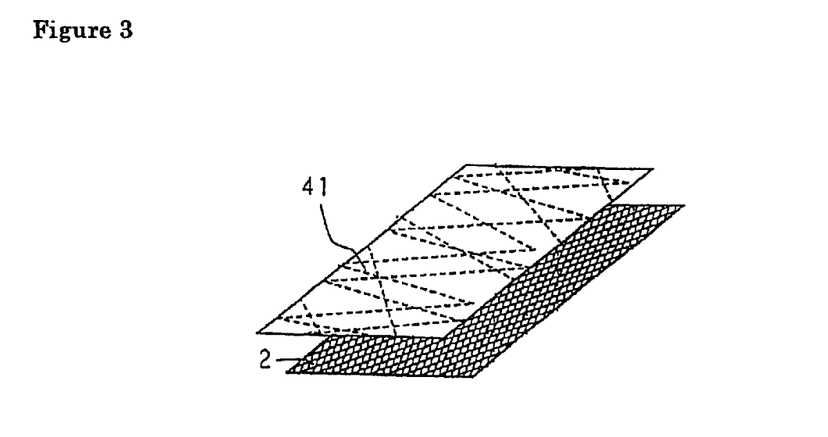

The FIG. 3 is the sidelong figure of the other example of the electromagnetic wave shield material used for this invention.

In this example, the electromagnetic waves shield material is made by adhering the electromagnetic waves shield 2 to the back of the sheet material 41 which has the decorative elements of the wallpapers, the curtains and so on. It has an electromagnetic waves shield effect without harming the decorative property of the sheet material 41.

Making a transparent plastic board the one that is sign 41 with the constitution similar to the 3rd figure, even the applied example that does above net 2 to this board fitting by fever dissolve in the interval 5~15 cm is effective. Does, for example be used the one who adhered as, as box form inside and this board a net the shielding box of an electron instrument. We are able to offer the low cost shielding box of the simple type that can prevent that an electron instrument actuates wrong by external noise.

Also, even application of the others as an adhesion seat is conceivable the one that is sign 41 in the constitution of the 3rd figure.

The electromagnetic wave shielding material of this example forms an electromagnetic wave shielding seat, by overlaying adhesion or adhesion seat to the one side of above net 2. This seat is able to adhere to synthetic resin etc. briefly. The operation is brief because we only attach it to other material in this case, and even the cost performance is high. The engine of the electron instrument, automobile such as the correspondence instrument, personal computers, monitors of the household electric appliances (a television, washing machines, drying machines, microwave oven etc.), telephone bases, mobile phone etc. surrounding, this seat can use it for the inside tension of the instrument such as cockpit surrounding, or seat surrounding and inside armor of driver's seat surrounding, high-class machine.

Figure 4:
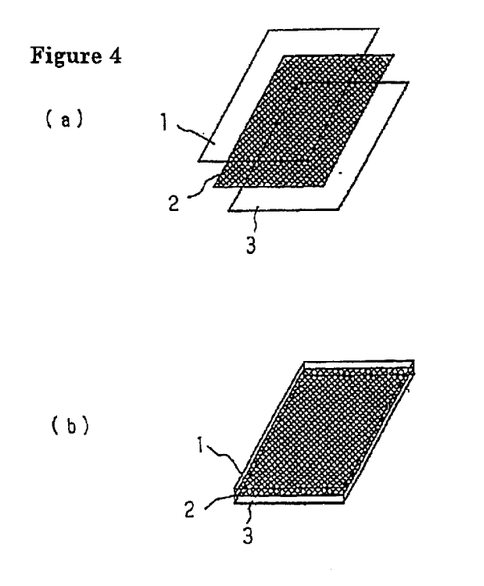

The FIG. 4 is the decomposed structural figure of other example for electromagnetic waves shield material that is used in this invention. 1 and 3 in the figure are the soft sheet material made of transparent bendable polyvinyl chloride and 2 is the above described electromagnetic waves shield net. The coarseness of the net is below 1.5 mm and has the light permeability. (a) On the both sides of the electromagnetic waves shield net 2, above soft sheet material 1 and 3 are laminated. (b) The electromagnetic waves shield material of this example (transparent laminated sheet) is transparent, soft and elastic.

In addition to the above laminated structure of which soft sheet material 1 and on the both side of the electromagnetic waves shield net 2, it is also suitable for the soft sheet material 1 and 3 to be laminated on the one side of the electromagnetic waves shield net 2.

Figure 5:
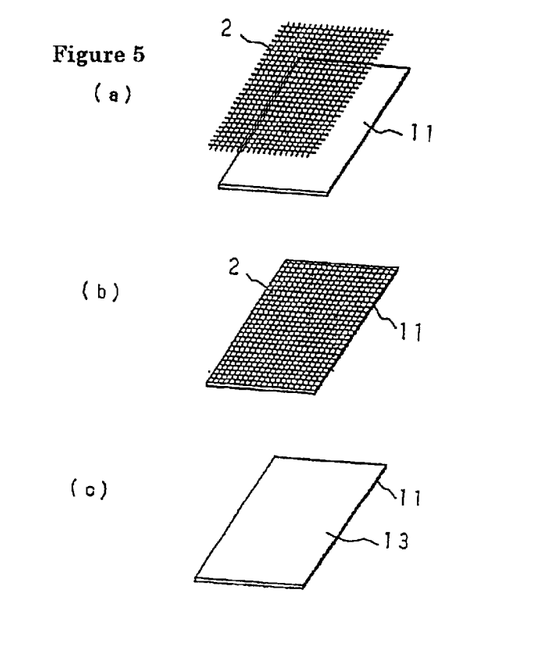

FIG. 5 is other decomposed structural figure of the electromagnetic waves shield material used for this invention. In the figure, 11 is the synthetic leather base cloth made of tricot whose contractibility is small or hard to lengthen.

Above electromagnetic waves shield net 2 is pasted on the base cloth 11. (a)(b) Next, polyurethane resin is coated on the side of the electromagnetic waves shield net 2 of the above pasted basic cloth 11 to make surface layer of the synthetic leather 13. (c) After wet coating the polyurethane resin, finish coating by dry coating.

When the mobile phone cases are sewed with this electromagnetic waves shield material of this example, the goods do not get out of shape, look high quality, and are stainless and stain is not highlighted when they get dirt.

In above electromagnetic waves shield material and net of this invention, below 1.5 mm of the coarseness of electromagnetic waves shield net 2 reflects or absorbs the electromagnetic waves to changes to the heat energy and cuts off 97~98% of the electromagnetic waves over 200 MHz. In over 1.50 m of the coarseness, the shield effect is reduced in proportion to the mesh coarseness.

Figure 6:
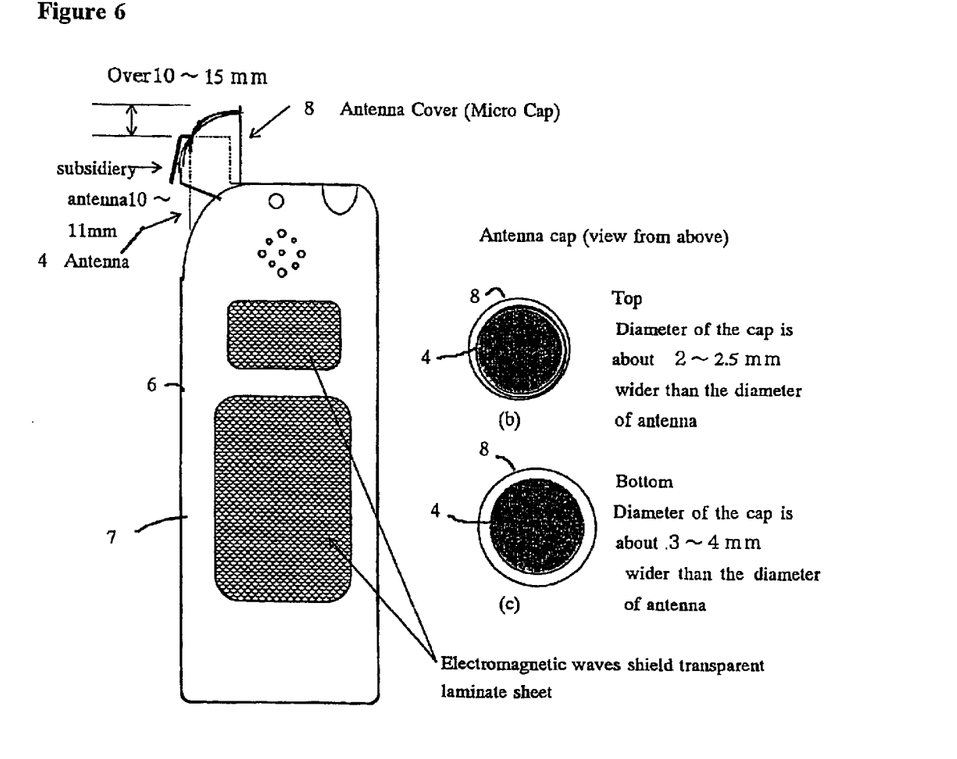

FIG. 6 is the basic structure of the electromagnetic waves shield mobile phone case of this invention. The FIG. 6 is the figure that a mobile phone is being inserted into the said mobile phone case.

Figure 10:
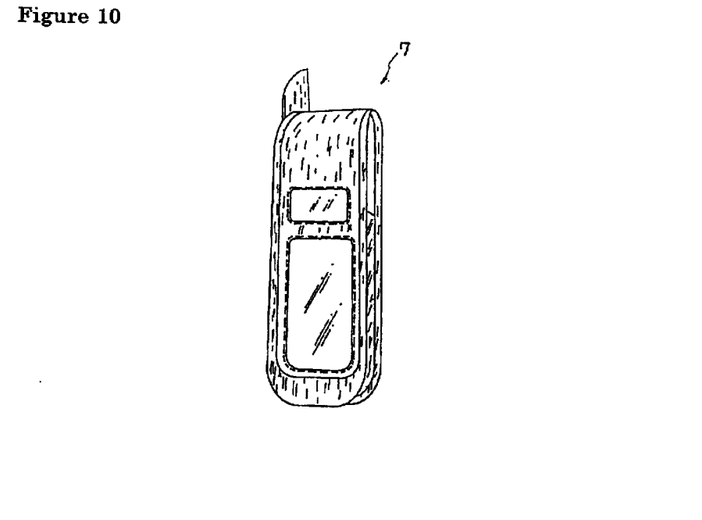
Figure 11:
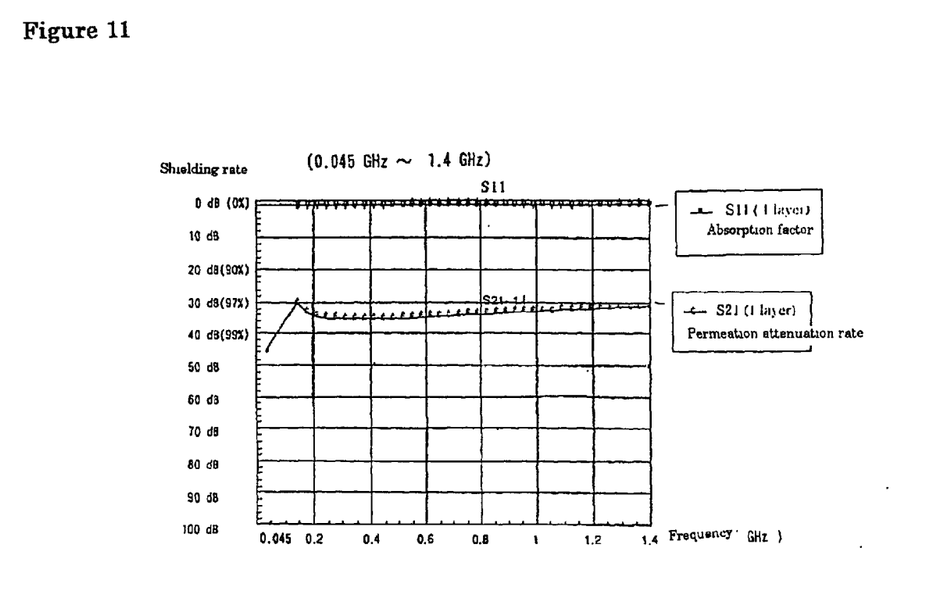
Figure 12:
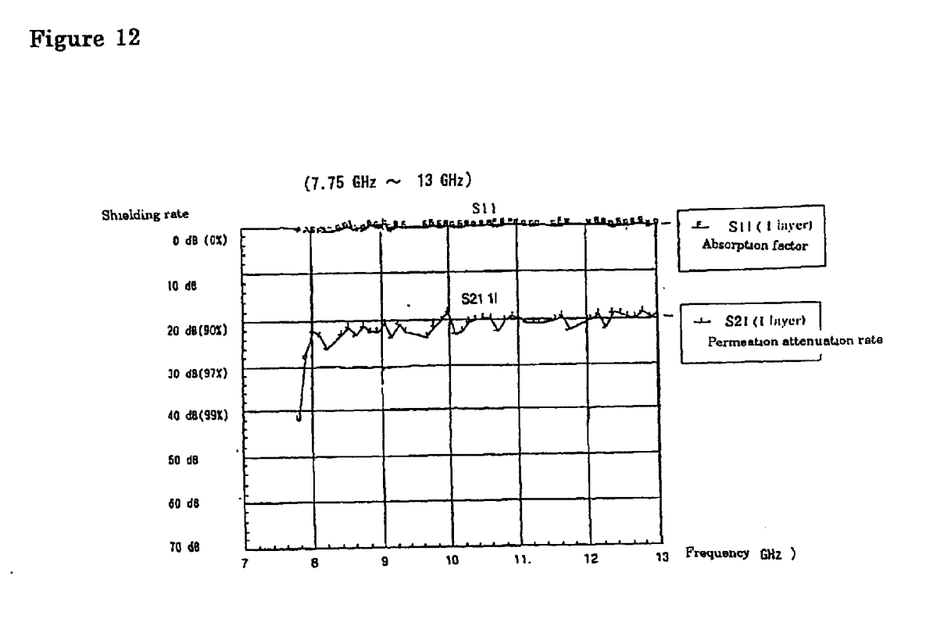
Figure 13:
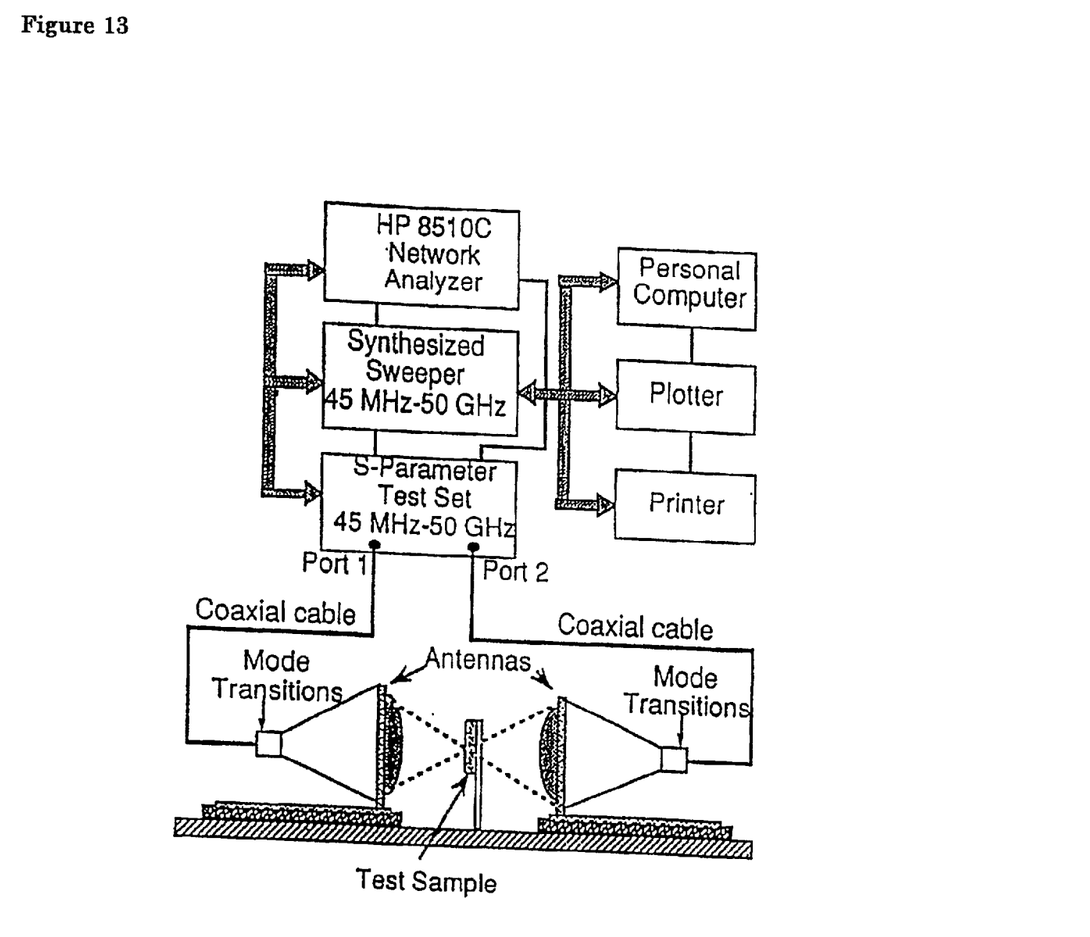
(FIG. 13)
It is the figure that shows the experimental device that was used to above measurement (FIG. 14)
It is the diagram that shows the experiment condition and the others of above measurement
Figure 14:
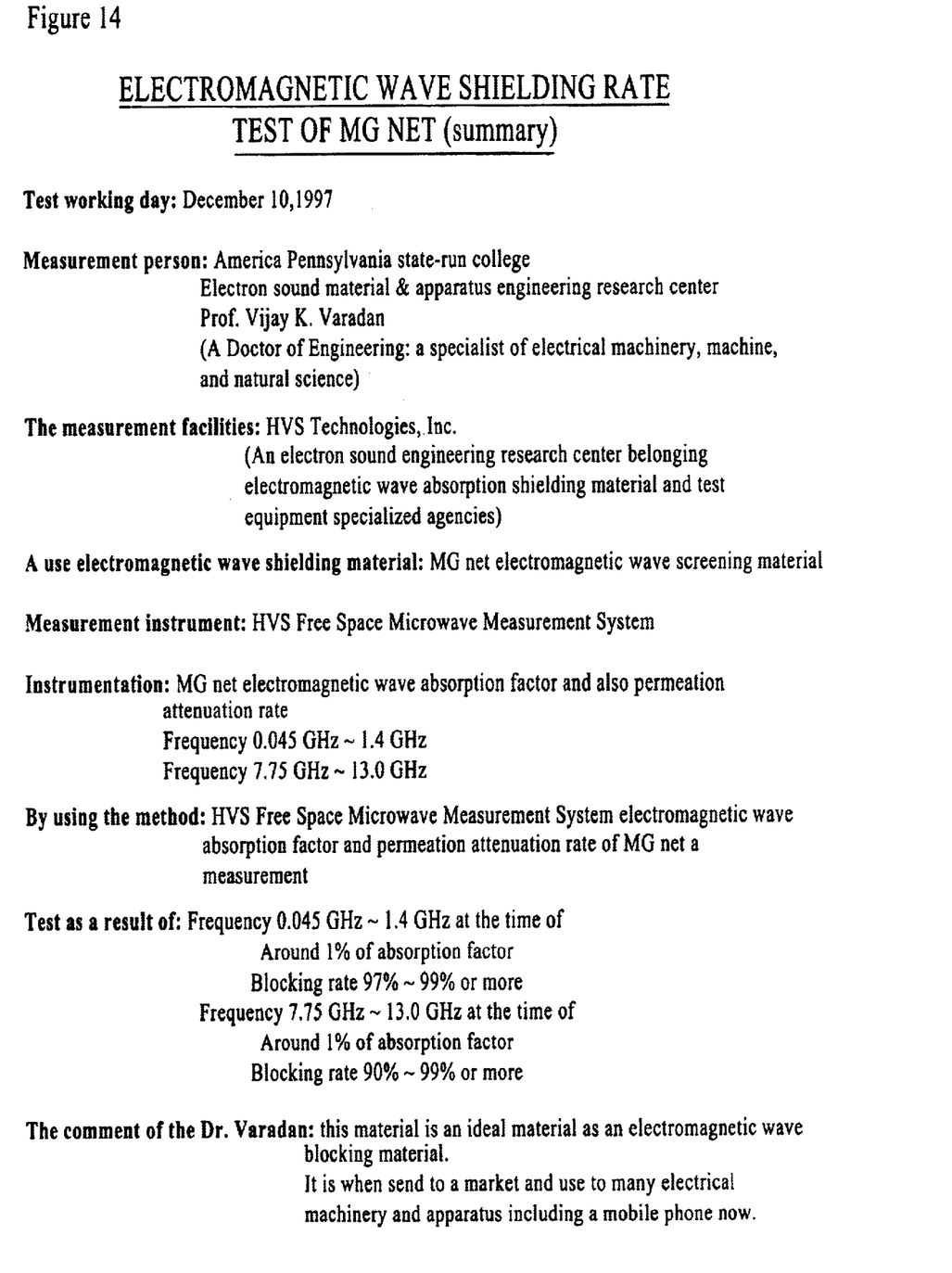

The FIG. 10 shows the whole external figure. 7 in the FIG. 6 is the main body of the mobile phone case in the FIG. 6. 8 in the FIG. 6 is the antenna cap connected with the mobile phone case body. The front (a transmitting and receiving side) and upper side (antenna side, 10, 17 of the FIG. 8) of the mobile phone case is made of electromagnetic waves shield material. The electricity with high frequency is conducted between above antenna cap and the front and the upper sides of the mobile phone case. The both sides of the mobile phone case (15 and 16 of the FIG. 8) is made of the non-electromagnetic waves shield material to make transmitting and receiving the electromagnetic waves to the side direction possible. For the bottom side, electromagnetic waves shield material can be used. However, usually the bottom side does not shield from the electromagnetic waves when the mobile phone case is made because the bottom side is made with the material connected with the above-described material for both sides of the mobile phone case. The backside of the mobile phone does not particularly need the electromagnetic waves shield because it is the opposite direction from the head, however, to obtain the high electromagnetic waves shield effect; the electromagnetic waves shield material is used for this example.

The material shown in the FIG. 2 is used for the above electromagnetic waves shield material. The structure of the material in the FIG. 2 is the electromagnetic waves shield net attached to the adhesive sheet or a bonding sheet. In the figure, 33 is the strippable paper. Or it is fit with the electromagnetic waves shield net 2 adhered to back of the decorative sheet material 41 shown in the FIG. 3. This electromagnetic waves shield net 2 is the net that the fibers which has the conductivity are knitted by the general knitting machine like a knitting machine for the tricot. They are the electromagnetic waves shield materials and the synthetic fibers. The former materials are micron order fibers of metal fibers carbon fibers and the like with conductivity. The latter fiber is polyester, which is to be the base material. The coarseness of the mesh is below 1.5 mm.

For the dial and liquid crystal indication part, the electromagnetic waves shield material with light permeability shown in the FIG. 4 is used. It is a sandwich structure of the above electromagnetic wave shied net 2 and the soft polyvinyl chloride sheet with permeability (1 and 3). The soft material 1 and 3 are adhered in laminate process.

The FIG. 5 is the other example of the electromagnetic waves shield. It is constructed with the electromagnetic waves shield net 2 and the synthetic leather base cloth 11 which consists of the tricot with little contractibility. The surface layer 13 of the synthetic leather is made by coating the surface of the electromagnetic waves shield net 2 of the basic cloth 11 with polyurethane.

Figure 7:
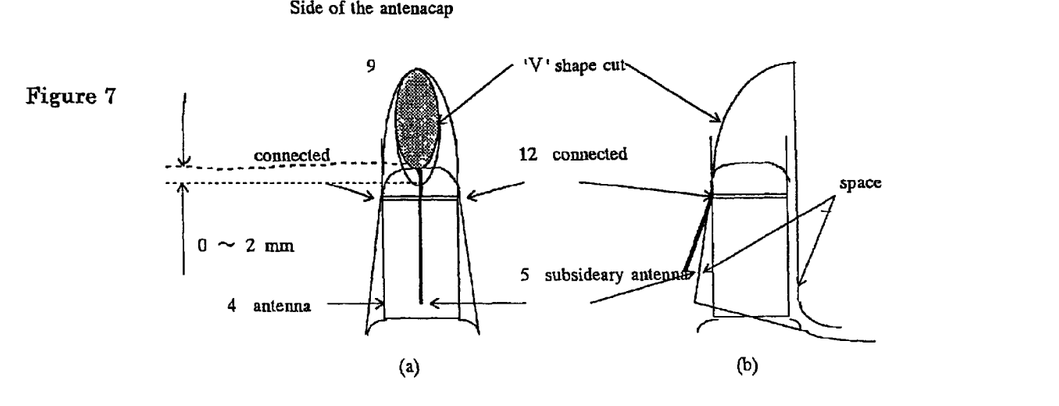

As shown in the FIGS. 6(*b*) and (C), and FIG. 7, the antenna cap has a simple conic shape. The space is less at the upper part than lower part. The top of the antenna is cut into 'V' as shown in the FIG. 7(*a*) and the shape of the opening is the simple oval. Also, as shown in the FIG. 6 (an arrow 4), the opening shape of the downward of the antenna cap is slightly spaced. The radio waves are emitted or received through the opening of the top and downward of the antenna, when antenna cap is attached. As shown in FIGS. 6(*a*) 6, the electromagnetic waves are emitted or received through the non-shield sides of the above mobile phone case and the downward opening of the antenna cap. Because the wire antenna of the mobile phone has the communication point of the radio waves closed to the center of the mobile phone. The antenna cap is attached by elastic like rubber to the place on the mobile phone case cover. The above elastic body material gives the easy attachment and makes the structure of the mobile phone case solid by preventing the cap from coming off easily.

The antenna cap is the conic tube made with a sheet of shield material. The shield material is folded into two and closed at the front. On the closed part of the front, an additional metallic pin antenna is attached as shown in the FIGS. 7, 5. The electricity of high frequency conducts between the upper end of the pin and the top part of the wire antenna of the mobile phone body as shown in the FIG. 7(*b*). Thus, the above additional antenna exposed to the out side also emits or receives the radio waves effectively.

When the antenna cap is attached to the wire antenna, the additional antenna is attached to the upper cover 10 of the mobile phone case so that the additional antenna naturally turns the face in the opposite direction (back direction of the mobile phone). The main direction of the radiation is the out side, and there is little radiation to the head direction.

For the front side of the liquid crystal and dial indication part of the mobile phone case 7, the transparent laminated electromagnetic shield sheet is used as shown in the FIG. 6(*a*) 13. The laminated sheet part is the 3 layered structure whose inside has the net with conductivity. Sheet has the softness and able to dial with the case on.

Figure 8:
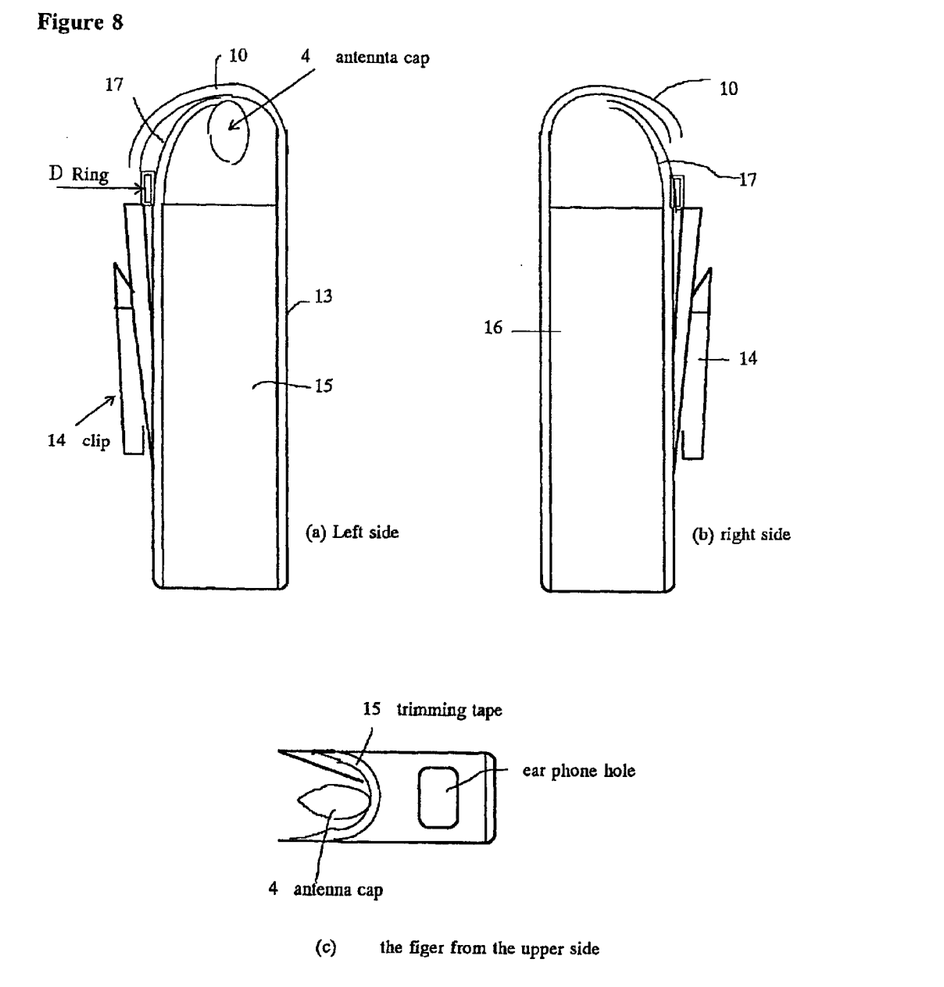
Figure 9:
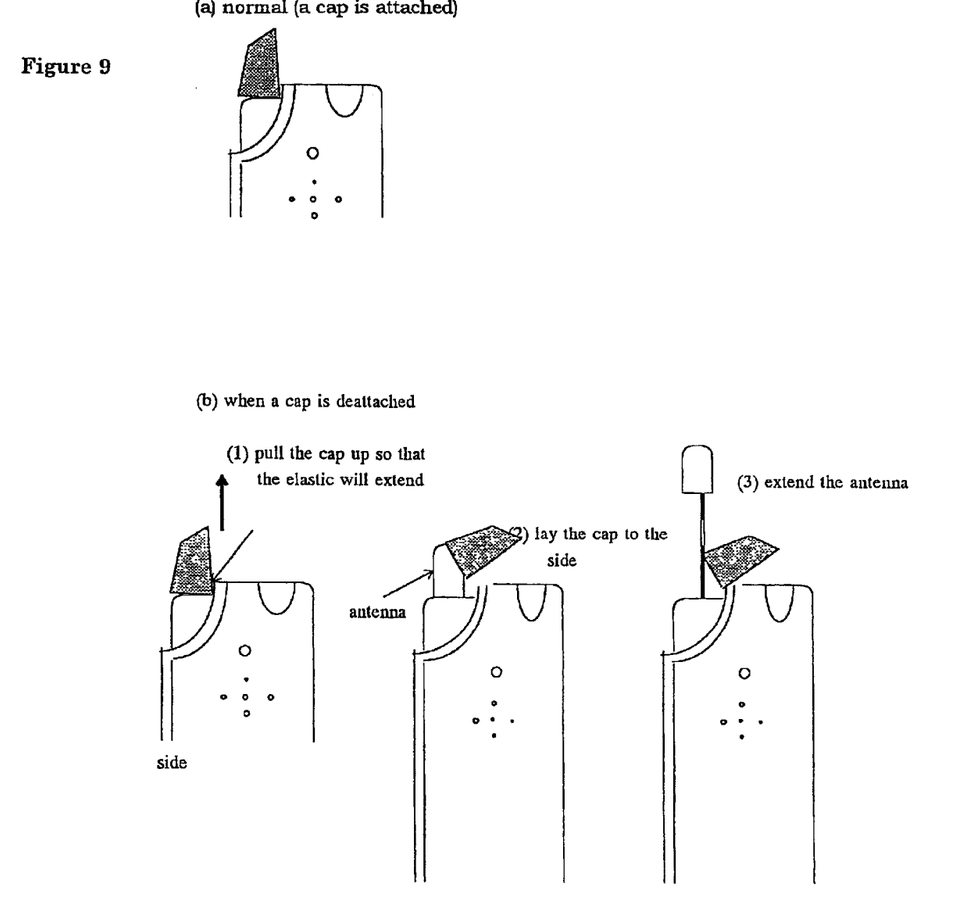

The FIGS. 8(*a*) and (*b*) shows the right and left sides of the mobile phone case of this invention. The FIG. 8(*c*) shows the upper side. 14 of the FIG. 8 is the clip to attach to the band and so on. FIGS. 8(*a*) 13 is the mobile phone case front where dial buttons and so on are. The weak end side of the antenna cap is reinforced with the trimming tap as shown in the Figure (c). The FIG. 9 shows how to attach the antenna cap. Under normal conditions, the communication is made with the cap on as shown in the FIG. 9(*a*). When it is hard to communicate due to a weakness of the electric field, the mobile phone case can be used without a cap and by extending the antenna as shown in the same Figure (b).

We have measured the magnetic field, the radio waves and the density of the electrical power of the mobile phone with and without using the electromagnetic wave shield mobile phone case.

The mobile phone used for the measurement was set up on a stand where 1.1 m from the ground with the antenna inside of the case. It was measured in dialing mode after taking an enough time until the radiation by dialing becomes stable. The measurement points (heights) were the center of the key panel (above described control panel) and the center of the antenna. The directions of the measurement were the front of the each measurement points (key, switch side), light (antenna side), left, and the back. And the distance of the measurement in magnetic field was 0 cm (When the mobile phone case was attached to the mobile phone, took a closest point to the measuring instrument for 0 cm of the distance of the measurement.), 2.5 cm, 5 cm, 10 cm, 30 cm. For the distance of the measurement in radio waves and density of the electric field and the electrical power, they were 5 cm, 10 cm and 30 cm.

MA841 (style number MA8411D MOVA K) was used as a mobile phone to be measured. CLOSE-FIELD PROBE (HP11940A: made by Hewlett Packard) was used as a measuring sensor to measure the intensity of the magnetic field and electric field. The spectral analyzer (R3261B: made by ADVANTEST) for measuring the intensity of the magnetic field. BROADBAND EXPOSURE METER (made by HOLADAY INDUSTRIES) was used to measure the intensity of electric field. A 10 cm length of coaxial cable connected the sensor and the measuring instrument. The settings of the spectrum analyzer are:

the span 1 MHz, the resolving power range 10 KHz, Video range 10 KHz and the wave detective function a starting point.

The measured frequency was 946.4 MHz, the cable loss was 2.2 dB, and the antenna factor was 27.1 dB $\{((\mu A/m)/(\mu V)\}$.

The magnetic field was increased at the distance 0 cm right, left and back and 10 cm right from the measured height at the center of the key panel. And it was increased at 0 cm back from the measured height at the center of the antenna. It shows that the mobile phone used electromagnetic waves shield material of this invention reflects the electromagnetic waves to the directions other than to front direction and eliminates the effect of the electromagnetic waves to the human body. The increase of the electromagnetic waves to the other directions shows that the attachment of the mobile phone case does not reduce the function of the mobile phone communication.

Above result of the measurement shows that the high electromagnetic waves shield effect to the human body is obtained when the mobile phone case with the electromagnetic waves shield material of this invention is attached to the mobile phone. And the electric field decreased to any direction shows that the malfunction of the other instrument is avoidable.

The electromagnetic wave shielding net of this invention has the compatibility that can use a conventional electric conduction nature fiber as an electromagnetic field shielding material with only briefer processing even if correspond to any instruments and have the characteristic like the following, compared with the cloth state electromagnetic wave shielding material that interwove or crowded and knead.

When a characteristic is enumerated below,

1. Electromagnetic Wave Shielding and also Absorption Effect

Like the electromagnetic wave shielding net of this invention the structure that an electric conduction nature fiber fellow is contacting directly nets because the electric conduction nature between an electric conduction nature fiber is kept well and the whole electric conduction nature high (an electricity surface resistance value: 0.05 Ω/sq.). Accordingly, even an electromagnetic wave shielding effect becomes high only the minute. Also, a surface area increases when it does it to a coil state (twine) like this invention, when it makes an electric conduction nature fiber reticulation and electromagnetic wave shielding and also absorption effect become high.

2. Static Electricity (Electrification) a Prevention Effect

The effect that discharges static electricity in the air because be causing a body surface area enhanced and make a coil state and the electricity surface resistance value makes 2 fiber twine besides below, 0.05 Ω/sq. is good electric conduction rate. Also, static electricity is easy to escape to an earth, because the electric conduction nature of a surface is high and have an electrification prevention effect. If we use this material to an electron instrument the adsorption etc. of the smoke of the dust and tobacco associated with electrification are able to be prevented. The housing of an electron instrument sometimes does unelectrolysis plating or steam plating due to electromagnetic wave noise prevention, there is not static electricity prevention effect enough to this plating.

3. A Cost

When the area that should block an electromagnetic wave like a large electricity product becomes wide an electromagnetic wave shielding material needs to be used voluminously. Therefore it assumed that a great cost needs it to electromagnetic wave shielding. When an electromagnetic wave shielding material is woven in a mesh state roughly like this invention cutting the dosage of a metal fiber material substantially this shielding material can be manufactured low cost. The electromagnetic wave shielding net of this invention decreased the quantity of the metal fiber material that uses it by using a general tricot-knitting machine, without requiring a special apparatus and succeeded in hypo low cost.

4. Anti Bacteria Nature

The metal coating of an electric conduction nature fiber being expressing in a surface as for the electromagnetic wave shielding net of this invention, be known that metal (an embodiment in silver) has an anti bacteria effect. It has the effect that the surface is kept clean, in the case that using the electromagnetic wave shielding net of this invention to the curtain or case inside a pocket telephone case or hospital, for example touch the hand.

6. Thermo-Resistant

The heat is added from the instrument that the electromagnetic wave shielding material, is applied, it depends on a use. Or, even that is used in the place of a high temperature is conceivable. It is a strong material to heat, without causing dissolution or deformation that the electromagnetic wave shielding net of this invention depends on a little heating. For example, there is not a problem even 200 or more degrees when is a tetlon thread and there is not a problem if an use it under 180° C. when it consists of a nylon thread a basic fiber. Although if it uses a carbon fiber material it becomes to heat a strong material more the electric conduction nature is used appropriately by a use because one of the metal fiber material is high.

6. Constrictive

The contraction rate is bigger, in comparison with the electromagnetic wave shielding material that was manufactured by using a woven fabric, because it is the net that the electromagnetic wave shielding net of this invention was knitted in a tricot state, there is flexibility. Therefore, it is very easy to use and overlay to other products, raw materials. Especially being having complicated form it is optimum in the small office automation instrument, correspondence instrument of size.

7. Form Stability

It is optimum to knit an electric conduction nature fiber in a tricot state, to fix the regular measure eye to reticulation (a hexagon form). The electromagnetic wave shielding effect that tricot knitting stabilized by maintaining the regular measure eye and can keep the regular measure eye is obtained.

8. Ventilation Nature/Heat Transfer Nature

There is ventilation nature, because the electromagnetic wave shielding net of this invention is the net state of defect unlike a usual textile and knitting, and the heat transfer nature even is high, do not damage the radiation effect of an electron instrument even in the case that an used to an electron instrument.

9. Light Nature

Unlike a usual textile and knitting, the electromagnetic wave shielding net of this invention is ultra light (about 20 $g/m^2$), because it is the net state of defect.

10. Hypo Public Pollution/Energy Conservation

Usually, the housing of the electron instrument is metal plate itself, whether or not it does unelectrolysis plating or steam plating to plastic due to electromagnetic wave noise prevention and there are many cases it prepares it. There is the problem of water quality contamination because the unelectrolysis plating uses a harmful chemical substance (cyanogens etc.) and even the investment in plant and equipment is not easy. Also, there is a problem environmentally, to increase the operation quantity. Also, wear steam plating and metal plate formation it does not result, if the net of this invention is used, although $CO_2$ is excreted and use heat energy a lot an above problem.

AVAILABILITY OF USING IN INDUSTRY

As described above, the electromagnetic waves shield net of this invention is the mesh made of the fibers with conductivity. It is possible to weave by using a general knitting machine like a machine for knitting the tricot. The quantity of the fibers is little and the cost is not much when it is used for the large electric appliances that need the large area to shield the electromagnetic waves. The length and breadth of the above electromagnetic waves shield net 2 controls the moves each other and maintains the coarseness of the mesh. The conductivity of the fibers tangled each other at the crossing of the mesh makes to increase the rate of reflection and absorption and electromagnetic waves shield effect.

In the electromagnetic waves shield net and material of this invention, the fibers with conductivity are coiled up to make the surface area of the twisted fibers increase. Increased surface area increases the rate of reflection, absorption of the electromagnetic waves and the electromagnetic waves shield effect.

The radiation of the electromagnetic waves to the head of the mobile phone user is not much when the electromagnetic waves shield mobile phone case of this invention is used. It reduces the harmful effects to the head a lot. It also prevents the malfunction of the medical instruments like a hearing aid and so forth and the trouble of the pacemakers.

On the other hand, the lowering of the efficiency of the communication does not occur, because the enough communication of the electromagnetic waves except for the head can be made. The cross range directivity of the mobile phone antenna falls only to the head direction. The long distance directivity is almost the same with a former antenna pattern.

Also, the middle is seen, if a use the electromagnetic wave shielding material of this invention as the electromagnetic wave prevention shielding case of an electron instrument and a simple cheap shielding case able to materialize.

Furthermore, it is brief able to prevent the wrong action of the pacemaker by external noise, if the patient who is using a cardiac pacemaker uses an above electromagnetic wave shielding net as the clothes and can use it as cheap clothes.

We overlay with other base material the electromagnetic wave shielding net of this invention, in addition to using net itself alone and are possible to apply to various uses. We overlay and a that method stretches it to only the method and one side that insert both sides of an above net with other material and there is the method that combines it. Below, the example is shown.

a. Stretching inside of the birthplace material, the core ground, hot carpets, construction material boards of clothes quality we overlay this net to the product of the established as the makeup seat for wallpaper, curtain, armor singly.

b. An electromagnetic wave shielding seat is formed, by overlaying adhesion or attachment seat to the one side of this net. This seat is able to adhere to synthetic resin etc. briefly. The handling is brief because we only attach it to other material and even the cost performance is high. This seat can use it for the inside tension of the instrument such as cockpit surrounding, or seat surrounding and inside armor of engine surrounding, driver's seat surrounding, airplanes of the electron instrument, automobile of the correspondence instrument, personal computers, monitor etc. of the household electric appliances (a television, washing machines, drying machines, microwave oven etc.), telephone bases, carrying telephone etc.

c. It inserts and molds this net in the molding of plastic and rubber. We are able to use the material that was molded and was insert as the housing and package of the electron instrument that require the high frequency noise measure of the correspondence instrument, personal computers, monitor etc. of the household electric appliances (a television, washing machines, drying machines, microwave oven etc.), telephone bases, carrying telephone etc. like the above, and can use for the electron instrument that requires the high frequency noise measure such as cockpit surrounding, or seat surrondings of engine surrounding, driver's seat surrounding, airplanes of an automobile.

d. Making a seat state the rubber and resin that were crowded and knead the ferrite of a magnetic substance we can develop the high material of electromagnetic wave absorption efficiency, by taking the many layer body structure with the above electromagnetic wave shielding net of this invention.

e. The indication part of the operation part and also display etc. of the switch, key etc. of the electron instrument are the necessary condition that permit and watch the location, functions, indication contents etc. Combining tension to the seat material such as the polyester chloridation vinyl resin of the soft quality that has a passable and nature and be transparent, in the case that such transparent nature is requested by laminate processing etc. an can offer transparent, flexible electromagnetic wave shielding material.

f. Synthesis leather etc. of contraction rate of small, an electromagnetic wave shielding material is formed, by combining and stretch the base cloth that consists of the tricot ground which is difficult to grow to one side. In this case, an am able to offer the material that has a high-class impression, decoration impression, without doing and collapse a type even if it does sewing production to a solid, to be.

What is claimed are:

1. An electromagnetic waves shield net comprising fibers with conductivity twisted and woven into tricot mesh whose coarseness is below 1.5 mm, wherein the coarseness of the mesh is maintained invariable by controlling the movement of the length and breadth fibers of the mesh.

2. The electromagnetic waves shield net described in the claim 1, wherein the above described fiber has electricity conductivity and are twisted.

3. An electromagnetic waves shield net comprising conductive fibers twisted and woven into tricot mesh whose coarseness is below 1.5 mm, wherein the coarseness of the mesh is maintained invariable by controlling the movement of the length and breadth fibers of the mesh, and said conductive fibers are pasted to the adhesive sheet or bonding sheet.

4. An electromagnetic waves shield net comprising conductive fibers twisted and woven into tricot mesh whose coarseness is below 1.5 mm, wherein the coarseness of the mesh is maintained invariable by controlling the movement of the length and breadth fibers of the mesh, wherein the conductive fibers are pasted to the synthetic leather composed with the woven basic cloth and the synthetic resins surface.

* * * * *